United States Patent
Hattori et al.

(10) Patent No.: US 8,027,170 B2
(45) Date of Patent: Sep. 27, 2011

(54) SUBSTRATE AND ELECTRONIC DEVICE USING THE SAME

(75) Inventors: Kazuo Hattori, Yasu (JP); Isamu Fujimoto, Yasu (JP)

(73) Assignee: Murata Manufacturing Co., Ltd., Nagaokakyo-shi, Kyoto-fu (JP)

( * ) Notice: Subject to any disclaimer, the term of this patent is extended or adjusted under 35 U.S.C. 154(b) by 501 days.

(21) Appl. No.: 12/340,965

(22) Filed: Dec. 22, 2008

(65) Prior Publication Data

US 2009/0166071 A1 Jul. 2, 2009

(30) Foreign Application Priority Data

Dec. 28, 2007 (JP) ................................ 2007-338407

(51) Int. Cl.
*H05K 7/00* (2006.01)

(52) U.S. Cl. ......................... 361/760; 361/734; 361/763

(58) Field of Classification Search ........................ None
See application file for complete search history.

(56) References Cited

U.S. PATENT DOCUMENTS

| | | | | |
|---|---|---|---|---|
| 5,315,486 A | * | 5/1994 | Fillion et al. | 361/795 |
| 6,140,891 A | * | 10/2000 | Nakakubo et al. | 333/204 |
| 6,577,490 B2 | * | 6/2003 | Ogawa et al. | 361/306.1 |
| 6,900,978 B2 | * | 5/2005 | Shimizu et al. | 361/328 |
| 7,193,862 B2 | * | 3/2007 | Maekawa et al. | 361/795 |
| 7,215,531 B2 | * | 5/2007 | Naito et al. | 361/306.1 |
| 7,684,204 B2 | * | 3/2010 | Lee et al. | 361/760 |
| 7,795,728 B2 | * | 9/2010 | Przadka | 257/724 |
| 7,835,157 B2 | * | 11/2010 | Tilmans et al. | 361/765 |

FOREIGN PATENT DOCUMENTS

| | | |
|---|---|---|
| JP | 6-349678 | 12/1994 |
| JP | 2003-282347 | 10/2003 |

* cited by examiner

*Primary Examiner* — Boris Chervinsky
(74) *Attorney, Agent, or Firm* — Dickstein Shapiro LLP

(57) ABSTRACT

An electronic device which includes a feedthrough capacitor mounted on a front surface of a substrate. A feedthrough electrode penetrates a laminate (body of the capacitor). External electrodes are electrically connected to opposite ends of the feedthrough electrode. A capacitor electrode is disposed to form capacity in cooperation with the feedthrough electrode. A wiring conductor is formed on a rear surface of the substrate or inside the substrate, and via-hole conductors are connected to the wiring conductor. The feedthrough electrode and the external electrodes constitute a first current path. The wiring conductor and the via-hole conductors constitute a second current path electrically connected in parallel to the first current path.

10 Claims, 10 Drawing Sheets

SUBSTRATE AND ELECTRONIC DEVICE USING THE SAME

BACKGROUND OF THE INVENTION

1. Field of the Invention

The present invention relates to a substrate and an electronic device using the substrate. More particularly, the present invention relates to a substrate on which a capacitor is to be mounted and to an electronic device using the substrate.

2. Description of Related Art

An MPU (Micro Processing Unit) is incorporated in electronic equipment such as a personal computer and a home game machine. A decoupling capacitor is disposed around the MPU. A main role of the decoupling capacitor is to remove noise that is parasitic on a power supply line extending from a power supply to the MPU, and to supply charges to the MPU when a supply voltage is varied.

Recently, with the use of a higher clock frequency in the MPU, the power supply line has become more apt to generate high-frequency noise. For that reason, a low ESL-type multilayer ceramic capacitor that is superior in impedance-frequency characteristic is used as the decoupling capacitor in many cases. Such a low ESL-type multilayer ceramic capacitor is described below with reference to FIGS. 5A and 5B. FIGS. 5A and 5B illustrate one example of low ESL-type feedthrough capacitor. Specifically, FIG. 5A is an external perspective view of a feedthrough capacitor 100, and FIG. 5B is an exploded perspective view of a laminate 102 of the feedthrough capacitor 100.

The feedthrough capacitor 100 is also called a 3-terminal capacitor, and it includes the laminate 102 and external electrodes 104a, 104b, 106a and 106b as shown in FIG. 5A. The laminate 102 is in the shape of a substantially rectangular parallelepiped and is made of stacked ceramic layers. The external electrodes 104a and 104b are formed on mutually opposite side surfaces of the laminate 102. Also, the external electrodes 106a and 106b are formed on the other mutually opposite side surfaces of the laminate 102, which differ from the side surfaces where the external electrodes 104a and 104b are formed.

As shown in FIG. 5B, the laminate 102 includes ceramic layers 108, 110, 112 and 114, capacitor electrodes 116 and 122, and a feedthrough (penetrating) electrode 120. The ceramic layers 108, 110, 112 and 114 are each an insulator layer that is substantially rectangular. The capacitor electrodes 116 and 122 are formed on the ceramic layers 110 and 114, respectively, and have lead electrodes 118a, 118b, 124a and 124b. The lead electrodes 118a and 124a serve to electrically connect the capacitor electrodes 116 and 122 to the external electrode 106a. The lead electrodes 118b and 124b serve to electrically connect the capacitor electrodes 116 and 122 to the external electrode 106b. Further, the feedthrough electrode 120 is formed so as to penetrate the laminate 102. Opposite ends of the feedthrough electrode 120 are electrically connected to the external electrodes 104a and 104b, respectively. The laminate 102 is constructed by stacking the above-described ceramic layers 108, 110, 112 and 114 in this order from the top.

In the above-described feedthrough capacitor 100, the capacitor electrodes 116 and 122 are opposed to the feedthrough electrode 120 with the ceramic layers 110 and 112 interposed respectively therebetween. Therefore, capacity is formed between the capacitor electrode 116 and the feedthrough electrode 120 and between the capacitor electrode 122 and the feedthrough electrode 120. In the above-described feedthrough capacitor 100, since the feedthrough electrode 120 serves also as a power plane, there is essentially no distance from the power plane to a capacity region. As a result, inductance of the feedthrough capacitor 100 is smaller than that of, e.g., a capacitor including a lead line between a power plane and a capacity region.

Hitherto, it has been usual that the feedthrough capacitor 100 is mounted on a substrate shown in FIGS. 6A and 6B. FIGS. 6A and 6B illustrate a known substrate 200 on which the feedthrough capacitor 100 is to be mounted. FIG. 6A is a top plan view of the substrate 200, and FIG. 6B is a sectional structural view of the substrate 200 and the feedthrough capacitor 100. In FIGS. 6A and 6B, the feedthrough capacitor 100 is indicated by dotted lines.

As shown in FIGS. 6A and 6B, the substrate 200 includes a substrate body 202, power planes 204a and 204b, lands 206a and 206b, via-hole conductors 208a and 208b, and a ground plane 210. When the feedthrough capacitor 100 is mounted on the substrate 200, the external electrodes 104a and 104b are electrically connected to the power planes 204a and 204b, respectively. Also, the external electrodes 106a and 106b are electrically connected to the lands 206a and 206b, respectively. The lands 206a and 206b are electrically connected to the ground plane 210, which is embedded in the substrate body 202, through the via-hole conductors 208a and 208b, respectively. The ground plane 210 is grounded.

Further, as shown in FIGS. 7A and 7B, there is known a substrate 300 in which the power planes 204a and 204b are embedded in the substrate body 202. When the feedthrough capacitor 100 is mounted on the substrate 300, the external electrodes 104a and 104b are electrically connected to lands 205a and 205b, respectively. Further, the lands 205a and 205b are electrically connected to the power planes 204a and 204b through via-hole conductors 209-1a, 209-2a and 209-3a and through via-hole conductors 209-1b, 209-2b and 209-3b, respectively.

In either case in which the feedthrough capacitor 100 is mounted on the substrate 200 shown in FIGS. 6A and 6B or on the substrate 300 shown in FIGS. 7A and 7B, a DC current including high-frequency noise is inputted to the external electrode 104a from the power plane 204a. Then, as indicated by solid-line arrows in FIGS. 6B and 7B, the DC current flows through the feedthrough electrode 120 and is outputted to the power plane 204b through the external electrode 104b. On the other hand, as indicated by dotted-line arrows in FIGS. 6B and 7B, the high-frequency noise is outputted to the ground plane 210 through the external electrodes 106a and 106b due to the presence of the capacity formed between the feedthrough electrode 120 and each of the capacitor electrodes 116 and 122. As a result, the high-frequency noise is removed from the DC current.

Lately, miniaturization of semiconductor structures has been progressed in order to employ a higher clock frequency in the MPU and to reduce the size of the MPU. With further miniaturization of semiconductor structures, a threshold voltage is reduced, and an operating voltage of the MPU is reduced correspondingly. On the other hand, the design rule of 90 nm or less tends to increase a leakage current generated inside a semiconductor and to increase power consumption of the MPU. Accordingly, a larger current has to be supplied from a power supply to an MPU using highly miniaturized semiconductors. This results in a larger current flow in the feedthrough electrode 120 of the feedthrough capacitor 100 which is disposed around the MPU.

However, when a larger current flows in the feedthrough electrode 120, the feedthrough capacitor 100 generates heat due to a residual resistance (i.e., an equivalent series resistance (ESR)) of the feedthrough electrode 120. In order to suppress the generation of heat, for example, Japanese Unexamined Patent Application Publication No. 6-349678 proposes an electronic device, and Japanese Unexamined Patent Application Publication No. 2003-282347 proposes a capacitor mounting structure. The proposed electronic device and capacitor mounting structure will be described below with reference to the drawings. FIGS. 8 and 9 are plan views each showing an electronic device described in Japanese Unexamined Patent Application Publication No. 6-349678. FIG. 10 is a sectional structural view of an electronic device in which the capacitor mounting structure according to Japanese Unexamined Patent Application Publication No. 2003-282347 is employed.

In the electronic devices shown in FIGS. 8, 9 and 10, a large current is prevented from flowing in the feedthrough electrode 120 by forming an additional current path in parallel to a current path formed by the feedthrough electrode 120. More specifically, in the electronic devices shown in FIGS. 8 and 9, the lands 205a and 205b, which are electrically connected to the power planes 204a and 204b (not shown in FIGS. 8 and 9), respectively, are electrically connected to each other through a wiring conductor (short-circuit electrode) 207. Also, in the electronic device shown in FIG. 10, the external electrodes 104a and 104b are electrically connected to the lands 205a and 205b, respectively, which are formed on the substrate body 202. The lands 205a and 205b are electrically connected to the power planes 204a and 204b, which are formed inside the substrate body 202, through the via-hole conductors 209-1a, 209-2a and 209-3a and the via-hole conductors 209-1b, 209-2b and 209-3b (only the via-hole conductors 209-1a and 209-1b being shown in FIG. 10), respectively. The power plane 204a and the power plane 204b are electrically connected to each other also through a wiring conductor (short-circuit electrode) 207. According to each of the electronic devices constructed as described above, a current inputted from the power plane 204a is divided and flows along the current path formed by the feedthrough electrode 120 and the additional current path formed by the wiring conductor 207 (see, e.g., arrows in FIG. 10). As a result, a large current is prevented from flowing in the feedthrough electrode 120.

However, the known electronic devices have the following problems. In the electronic device shown in FIG. 8, the wiring conductor 207 is formed in a linear shape. Inductance of the wiring conductor 207 in the linear form is relatively small. Therefore, impedance of the current path formed by the linear wiring conductor 207 is also relatively small. Hence, a part of the high-frequency noise is inputted to the current path formed by the wiring conductor 207. Consequently, the electronic device shown in FIG. 8 has the problem that the high-frequency noise cannot be sufficiently removed from the DC current.

In the electronic device shown in FIG. 9, the wiring conductor 207 is bent so as to bypass the feedthrough capacitor 100. The bent wiring conductor 207 has larger impedance than the linear wiring conductor 207 shown in FIG. 8. Accordingly, the electronic device shown in FIG. 9 can remove the high-frequency noise from the DC current to a larger extent than the electronic device shown in FIG. 8. However, the electronic device shown in FIG. 9 needs to have a space for the bent wiring conductor 207, whereby the size of the electronic device is increased.

In the electronic device shown in FIG. 10, the current path formed by the feedthrough electrode 120 includes the via-hole conductors 209-1a, 209-2a, 209-3a, 209-1b, 209-2b and 209-3b. Each of the via-hole conductors 209-1a, 209-2a, 209-3a, 209-1b, 209-2b and 209-3b has relatively large inductance. Accordingly, impedance of the current path formed by the feedthrough electrode 120 is also relatively large. Hence, a part of the high-frequency noise inputted from the power plane 204a is inputted to the current path formed by the wiring conductor 207. Consequently, the electronic device shown in FIG. 10 has the problem that the high-frequency noise cannot be sufficiently removed from the DC current.

SUMMARY OF THE INVENTION

Accordingly, an object of the present invention is to provide a substrate on which a capacitor is to be mounted and an electronic device using the substrate, which enables the capacitor or the electronic device to have high performance in absorbing noise and to be downsized.

A first aspect of the present invention provides an electronic device comprising a substrate having a first principal surface and a second principal surface, and a capacitor mounted on the first principal surface of the substrate. The capacitor includes a body, a feedthrough electrode penetrating the body, a capacitor electrode forming capacity in cooperation with the feedthrough electrode, a first external electrode and a second external electrode electrically connected to opposite ends of the feedthrough electrode, respectively, and a third external electrode electrically connected to the capacitor electrode. The substrate includes a wiring conductor formed on the second principal surface or inside the substrate, and a via-hole conductor formed inside the substrate and electrically connected to the wiring conductor. The feedthrough electrode, the first external electrode, and the second external electrode constitute a first current path. The wiring conductor and the via-hole conductor constitute a second current path electrically connected in parallel to the first current path.

According to the first aspect of the present invention, the first current path constituted by the feedthrough electrode and the second current path constituted by the wiring conductor are electrically connected in parallel to each other. Therefore, a DC current is divided to flow in the first current path and in the second current path. A large current is thereby avoided from flowing into the feedthrough electrode of the capacitor. As a result, heat generation of the feedthrough capacitor is suppressed.

Also, according to the first aspect of the present invention, since the wiring conductor is formed inside the substrate or on the second principal surface thereof, the capacitor and the wiring conductor can be arranged to overlap with each other when viewed from above. Stated another way, the first aspect of the present invention can eliminate the need of bending the wiring conductor so as to bypass the capacitor on the first principal surface of the substrate. As a result, the size of the electronic device can be reduced.

Further, the electronic device according to the first aspect of the present invention has high performance in absorbing noise. More specifically, in the electronic device according to the first aspect of the present invention, the second current path constituted by the wiring conductor includes the via-hole conductor having relatively high inductance. Therefore, the impedance of the second current path is relatively high. This causes high-frequency noise to flow into the first current path constituted by the feedthrough electrode and then toward the ground through the capacity formed between the feedthrough electrode and the capacitor electrode. As a result, according to the first aspect of the present invention, high-frequency noise can be efficiently removed from the DC current.

In the electronic device according to the first aspect of the present invention, the via-hole conductor may comprise a first via-hole conductor and a second via-hole conductor which are electrically connected to the wiring conductor, and the substrate may further include a first connecting conductor which is electrically connected to the first via-hole conductor and is electrically connected to the first external electrode, and a second connecting conductor which is electrically connected to the second via-hole conductor and is electrically connected to the second external electrode.

In the electronic device according to the first aspect of the present invention, the first connecting conductor may be a first power plane formed on the first principal surface of the substrate, and the second connecting conductor may be a second power plane formed on the first principal surface of the substrate.

In the electronic device according to the first aspect of the present invention, the substrate may further include a first power plane formed inside the substrate or on the first principal surface thereof and electrically connected to the first connecting conductor, and a second power plane formed inside the substrate or on the second principal surface thereof and electrically connected to the second connecting conductor.

In the electronic device according to the first aspect of the present invention, the wiring conductor may overlap with the feedthrough capacitor when viewed from a direction normal to the substrate.

A second aspect of the present invention provides a substrate having a first principal surface and a second principal surface, a capacitor being to be mounted on the first principal surface, the capacitor including a feedthrough electrode penetrating a capacitor body, and a capacitor electrode which forms capacity in cooperation with the feedthrough electrode. The substrate includes a wiring conductor formed on the second principal surface or inside the substrate, and a via-hole conductor formed inside the substrate and electrically connected to the wiring conductor. The wiring conductor and the via-hole conductor constitute a second current path electrically connected in parallel to a first current path which is constituted by the feedthrough electrode.

According to a preferred embodiment of the present invention, a first current path and a second current path are formed in an electronic device having a feedthrough capacitor mounted on a first principal surface of a substrate, and heat generation of the feedthrough capacitor can be suppressed. Also, according to the preferred embodiment of the present invention, a wiring conductor is formed inside the substrate or on a second principal surface thereof, and it is possible to reduce the size of the electronic device. Further, in the electronic device according to the preferred embodiment of the present invention, since the second current path constituted by the wiring conductor includes a via-hole conductor, high-frequency noise can be efficiently removed.

Other features, elements, characteristics and advantages of the present invention will become more apparent from the following detailed description of preferred embodiments of the present invention with reference to the attached drawings.

DETAILED DESCRIPTION OF THE PREFERRED EMBODIMENTS

A substrate and an electronic device using the substrate, according to an embodiment of the present invention, will be described below with reference to the drawings.
(Construction of Electronic Device)

Figure 1A:
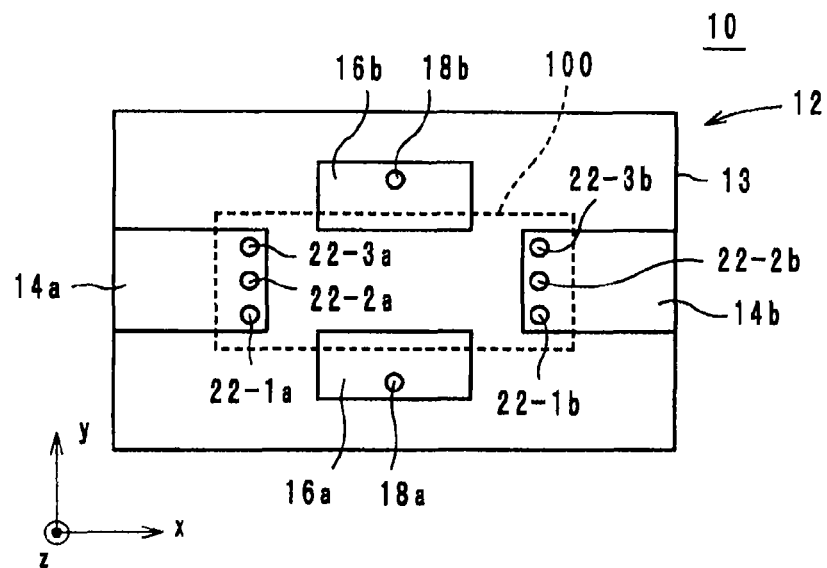
FIGS. 1A and 1B are a top plan view and a sectional structural view of an electronic device according to an embodiment of the present invention.
Figure 1B:
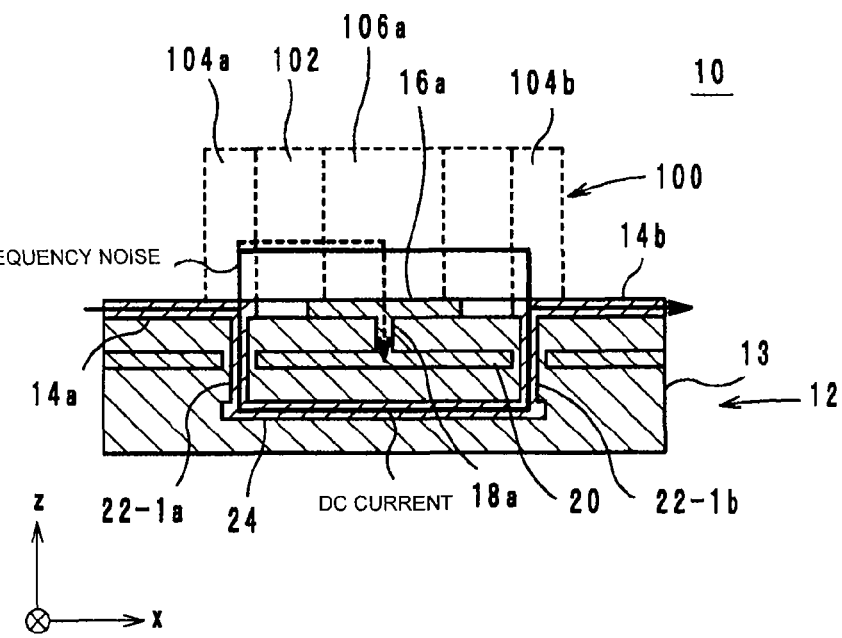
Figure 2:
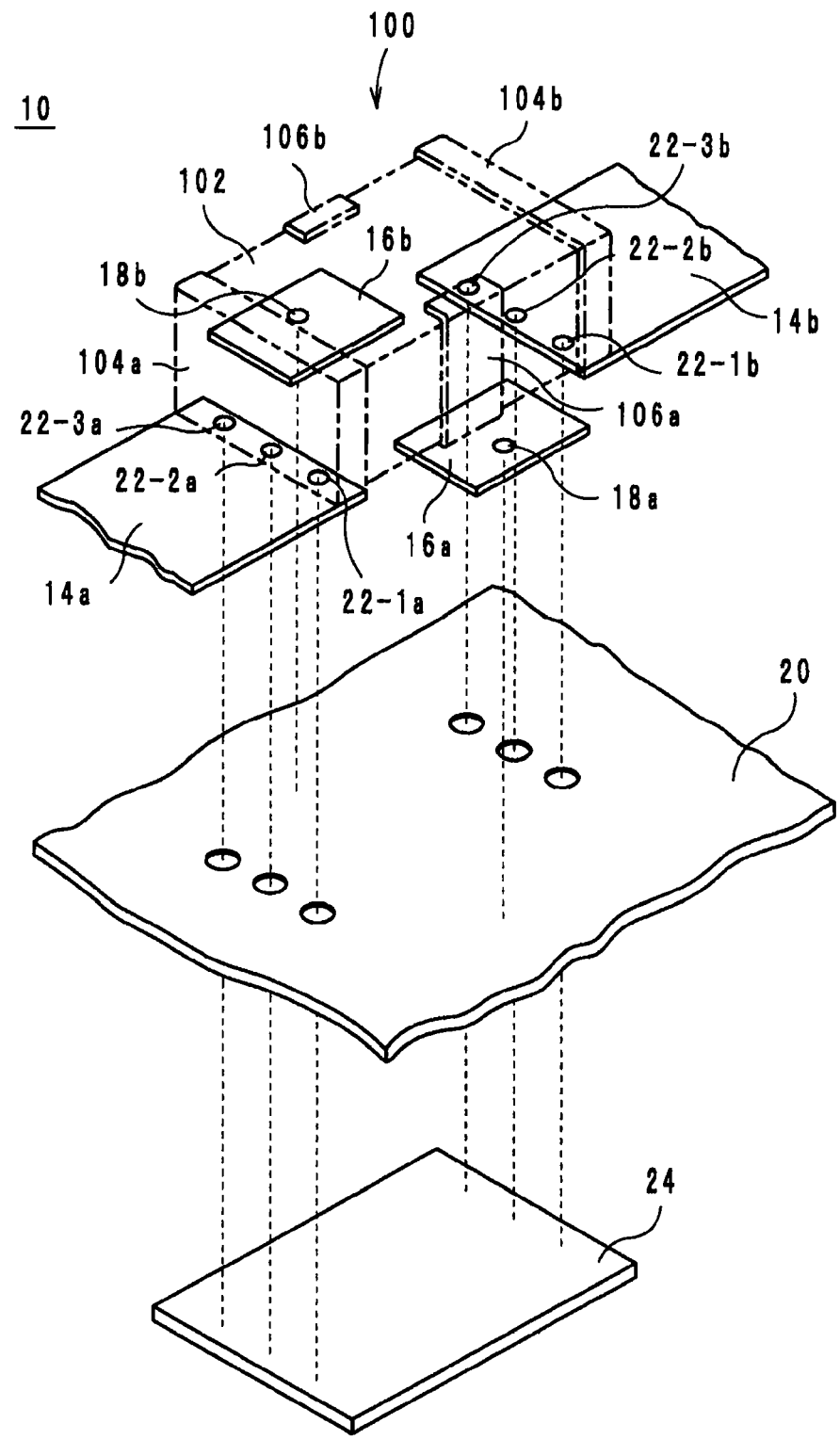
FIG. 2 is an exploded perspective view of a substrate of the electronic device shown in FIGS. 1A and 1B.

FIGS. 1A and 1B illustrate an electronic device 10 according to an embodiment of the present invention. Specifically, FIG. 1A is a top plan view of the electronic device 10, and FIG. 1B is a sectional structural view of the electronic device 10. FIG. 2 is an exploded perspective view of a substrate 12 of the electronic device 10. In FIGS. 1A, 1B and 2, a feedthrough capacitor 100 is indicated by dotted lines. Also, in the top plan view of FIG. 1A, it is assumed that a lengthwise direction of the feedthrough capacitor 100 defines the x-axis direction, a widthwise direction of the feedthrough capacitor 100 defines the y-axis direction, and a direction perpendicular to the x-axis direction and the y-axis direction defines the z-axis direction.

Figure 5A:
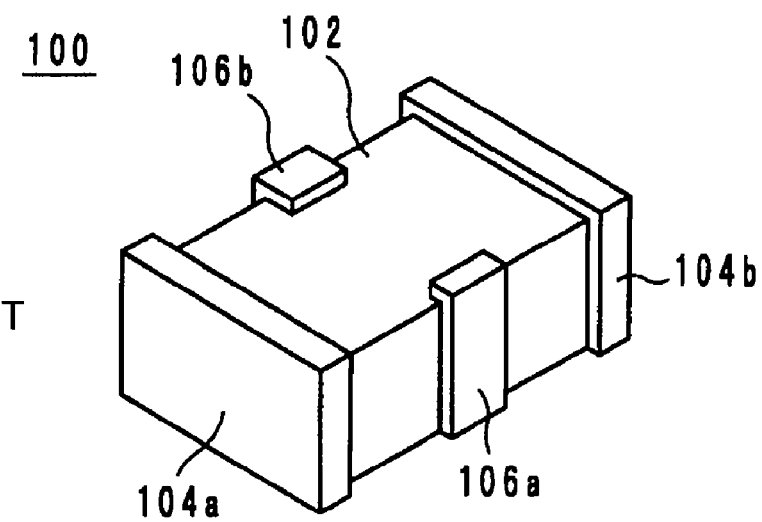
FIG. 5A is an external perspective view of a feedthrough capacitor.
Figure 5B:
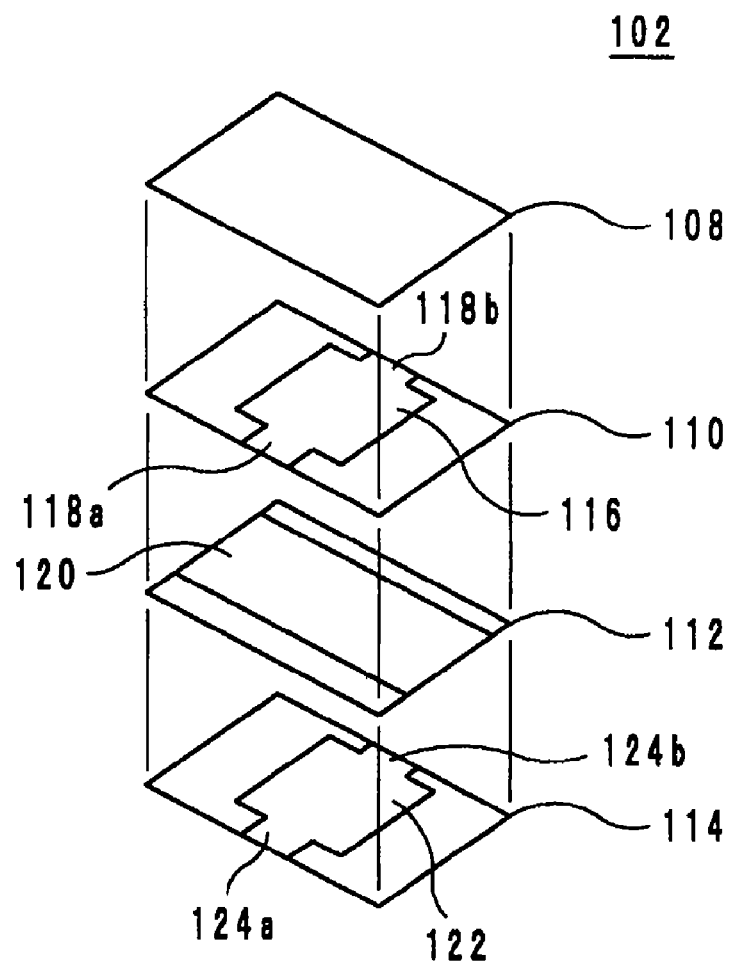
FIG. 5B is an exploded perspective view of a laminate of the feedthrough capacitor.
Figure 6A:
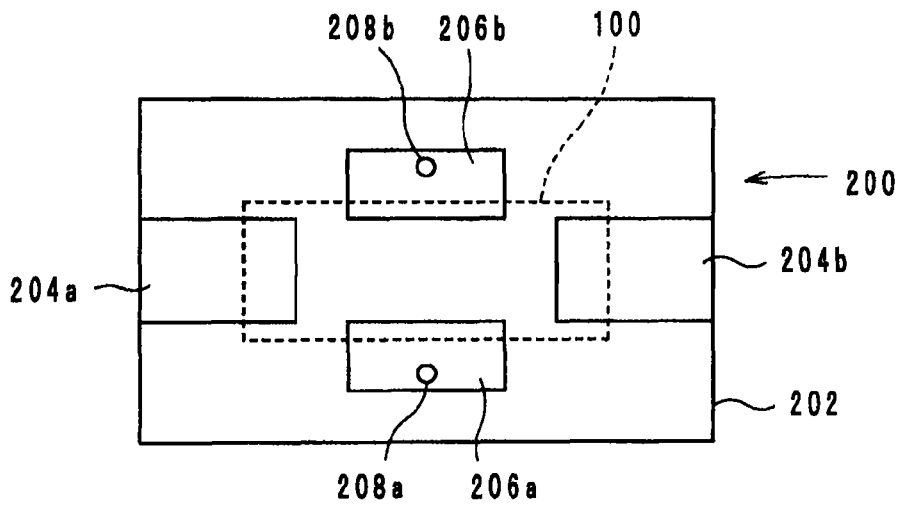
FIG. 6A is a top plan view of a known substrate.
Figure 6B:
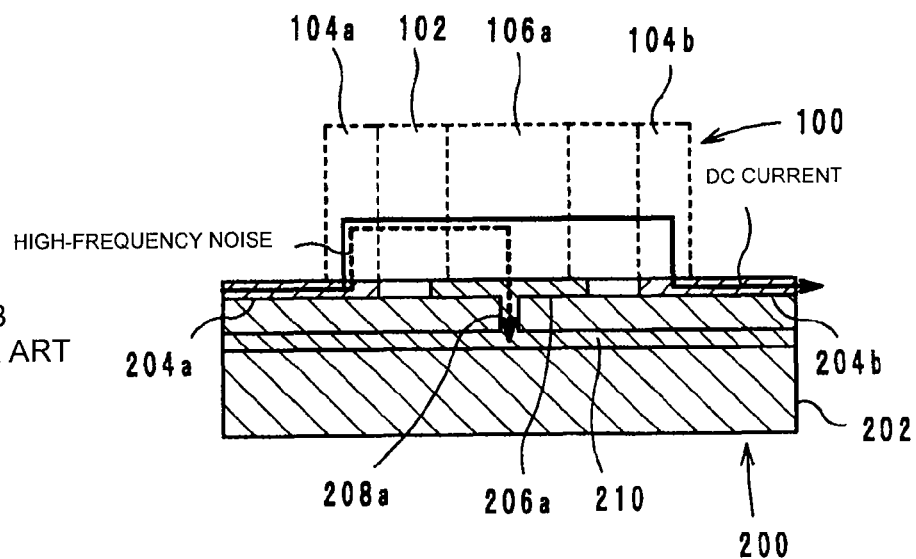
FIG. 6B is a sectional structural view of the known substrate with a feedthrough capacitor mounted thereon.

The electronic device 10 includes the substrate 12 and the feedthrough capacitor 100. The feedthrough capacitor 100 has the same structure as that described above with reference to FIGS. 5A and 5B, and therefore a description of the feedthrough capacitor 100 is omitted here. As shown in FIGS. 1A, 1B and 2, the substrate 12 includes a substrate body 13, power planes 14a and 14b, lands 16a and 16b, via-hole conductors 18a and 18b, a ground plane 20, via-hole conductors 22-1a, 22-2a, 22-3a, 22-1b, 22-2b and 22-3b, and a wiring conductor (short-circuit electrode) 24. The feedthrough capacitor 100 is mounted on a first principal surface of the substrate 12. In the following description, it is assumed that, as viewed on FIG. 1B, an upper surface of the substrate 12 is the first principal surface, and a lower surface of the substrate 12 is a second principal surface.

The substrate body 13 is provided, for example, as a circuit board formed by stacking a plurality of resin layers. The power planes 14a and 14b are formed on the first principal surface of the substrate body 13 and serve as parts of wiring extending in the x-axis direction. For example, a power supply is electrically connected to one end (not shown in FIGS. 1A, 1B and 2) of the power plane 14a. The other end of the power plane 14a is electrically connected, as shown in FIGS. 1A, 1B and 2, to an external electrode 104a of the feedthrough capacitor 100. For example, an MPU is electrically connected to one end (not shown in FIGS. 1A, 1B and 2) of the power plane 14b. The other end of the power plane 14b is electrically connected, as shown in FIGS. 1A, 1B and 2, to an external electrode 104b of the feedthrough capacitor 100. With such an arrangement, the external electrode 104a, a feedthrough electrode 120 (see FIG. 5B), and the external electrode 104b form a first current path between the power plane 14a and the power plane 14b.

The wiring conductor 24 serves as a part of wiring formed inside the substrate body 13 extending in the x-axis direction, and as shown in FIG. 2, the wiring conductor 24 and the feedthrough capacitor 100 overlap with each other when viewed from a direction normal to the substrate 12. The wiring conductor 24 is designed so as to have a smaller DC resistance than the feedthrough electrode 120. Opposite ends of the wiring conductor 24 overlap with the power planes 14a and 14b, respectively, when viewed from the z-axis direction. The end of the power plane 14a in contact with the external electrode 104a is electrically connected to the end of the wiring conductor 24 thereunder through via-hole conductors 22-1a, 22-2a and 22-3a extending in the z-axis direction. Likewise, the end of the power plane 14b in contact with the external electrode 104b is electrically connected to the end of the wiring conductor 24 thereunder through via-hole conductors 22-1b, 22-2b and 22-3b extending in the z-axis direction. With such an arrangement, the via-hole conductors 22-1a, 22-2a and 22-3a, the wiring conductor 24, and the via-hole conductors 22-1b, 22-2b and 22-3b form a second current path, which is electrically connected in parallel to the first current path, between the power plane 14a and the power plane 14b. The second current path preferably has smaller impedance than the first current path.

The lands 16a and 16b are formed on the first principal surface of the substrate body 13 and serve as parts of wiring extending in the y-axis direction. As shown in FIGS. 1A, 1B and 2, respective one ends of the lands 16a and 16b are electrically connected to the external electrodes 106a and 106b of the feedthrough capacitor 100.

As shown in FIGS. 1B and 2, the ground pattern 20 is a planar conductor which is formed inside the substrate body 13 as a layer between the first principal surface of the substrate body 13 and the wiring conductor 24. The ground pattern 20 is grounded. Respective other ends of the lands 16a and 16b (i.e., the ends thereof other than the ends to which the external electrodes 106a and 106b are connected) are electrically connected to the ground patterns 20 through via-hole conductors 18a and 18b extending in the z-axis direction, respectively. With such an arrangement, capacitor electrodes 116 and 122 (see FIG. 5B) are electrically connected to the ground pattern 20 through the external electrodes 106a and 106b and the via-hole conductors 18a and 18b.

Further, as shown in FIG. 2, bores having larger diameters than the via-hole conductors 22-1a, 22-2a, 22-3a, 22-1b, 22-2b and 22-3b are formed in the ground pattern 20, and the via-hole conductors 22-1a, 22-2a, 22-3a, 22-1b, 22-2b and 22-3b pass through those bores, respectively. Such an arrangement prevents short-circuiting between any of the via-hole conductors 22-1a, 22-2a, 22-3a, 22-1b, 22-2b and 22-3b and the ground pattern 20.

(Advantages)

In the electronic device 10 including the substrate 12 of the above-described structure, the first current path formed by the feedthrough electrode 120 and the second current path formed by the wiring conductor 24 are electrically connected to each other in parallel. Therefore, as indicated by solid lines in FIG. 1B, a DC current is divided to flow from the power plane 14a into the first current path and the second current path. Such a current division prevents a large current from flowing into the feedthrough electrode 120 of the feedthrough capacitor 100. Particularly, in this embodiment, since the DC resistance of the wiring conductor 24 forming the second current path is smaller than that of the feedthrough electrode 120 forming the first current path, the greater part of the DC current flows through the second current path formed by the wiring conductor 24. As a result, heat generation of the feedthrough capacitor 100 is effectively suppressed.

Figure 9:
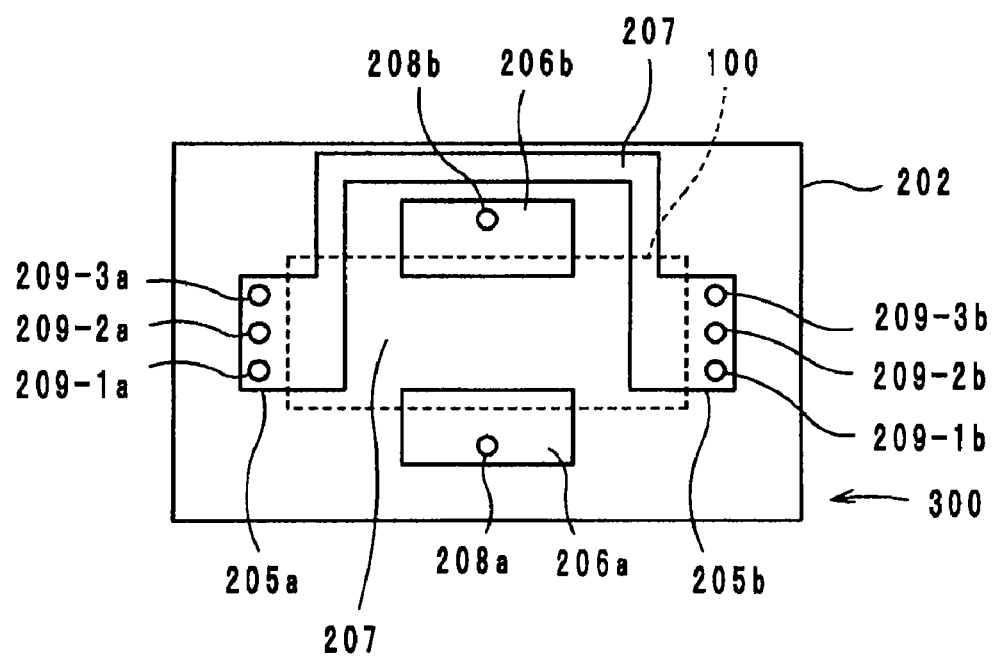
FIG. 9 is a top plan view of an electronic device described in Japanese Unexamined Patent Application Publication No. 6-349678.

Further, according to this embodiment, since the wiring conductor 24 is formed inside the substrate body 13, the feedthrough capacitor 100 and the wiring conductor 24 can be arranged, as seen from FIGS. 1A, 1B and 2, to overlap with each other when viewed from the z-axis direction. In other words, the electronic device 10 is not required to have the arrangement as shown in FIG. 9, i.e., the arrangement in which the wiring conductor 207 is bent so as to bypass the feedthrough capacitor 100. As a result, downsizing of both the substrate 12 and the electronic device 10 can be realized.

Still further, the electronic device 10 including the substrate 12 has high noise absorption performance, as will be described below. In the known electronic device shown in FIG. 10, the power plane 204a and the power plane 204b are directly connected to each other through the wiring conductor 207. The feedthrough electrode 120 of the feedthrough capacitor 100 is electrically connected to the power plane 204a through the via-hole conductors 209-1a, 209-2a and 209-3a, and to the power plane 204b through the via-hole conductors 209-1b, 209-2b and 209-3b. Generally, via-hole conductors have relatively high inductance. Therefore, the current path formed by the feedthrough electrode 120 has relatively high impedance. This causes a part of high-frequency noise to flow through the wiring conductor 207. As a result, in the electronic device shown in FIG. 10, the high-frequency noise cannot be sufficiently removed from a DC current.

In contrast, in the electronic device 10 of this embodiment, the power planes 14a and 14b are electrically connected to the wiring conductor 24 respectively through the via-hole conductors 22-1a, 22-2a and 22-3a, and through the via-hole conductors 22-1b, 22-2b and 22-3b. Therefore, the second current path formed by the wiring conductor 24 and the via-hole conductors 22-1a, 22-2a, 22-3a, 22-1b, 22-2b and 22-3b has relatively high impedance. This causes high-frequency noise to flow into the first current path formed by the feedthrough electrode 120 and then toward the ground through the capacity formed between the feedthrough electrode 120 and each of the capacitor electrodes 116 and 122. As a result, the electronic device 10 can remove high-frequency noise from the DC current more efficiently than the electronic device shown in FIG. 10.

(Modification)

Figure 3A:
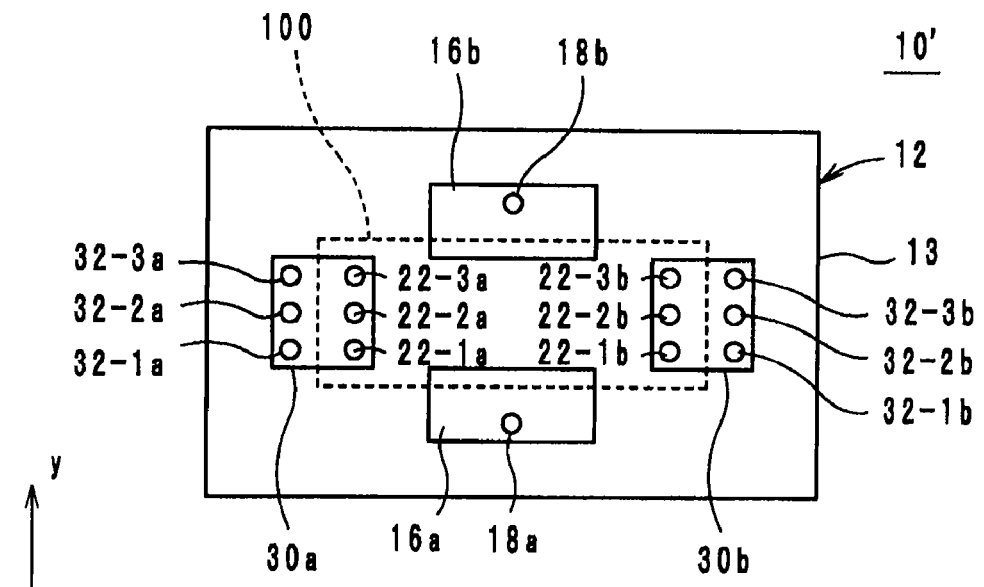
FIGS. 3A and 3B are a top plan view and a sectional structural view of an electronic device according to a modification.
Figure 3B:
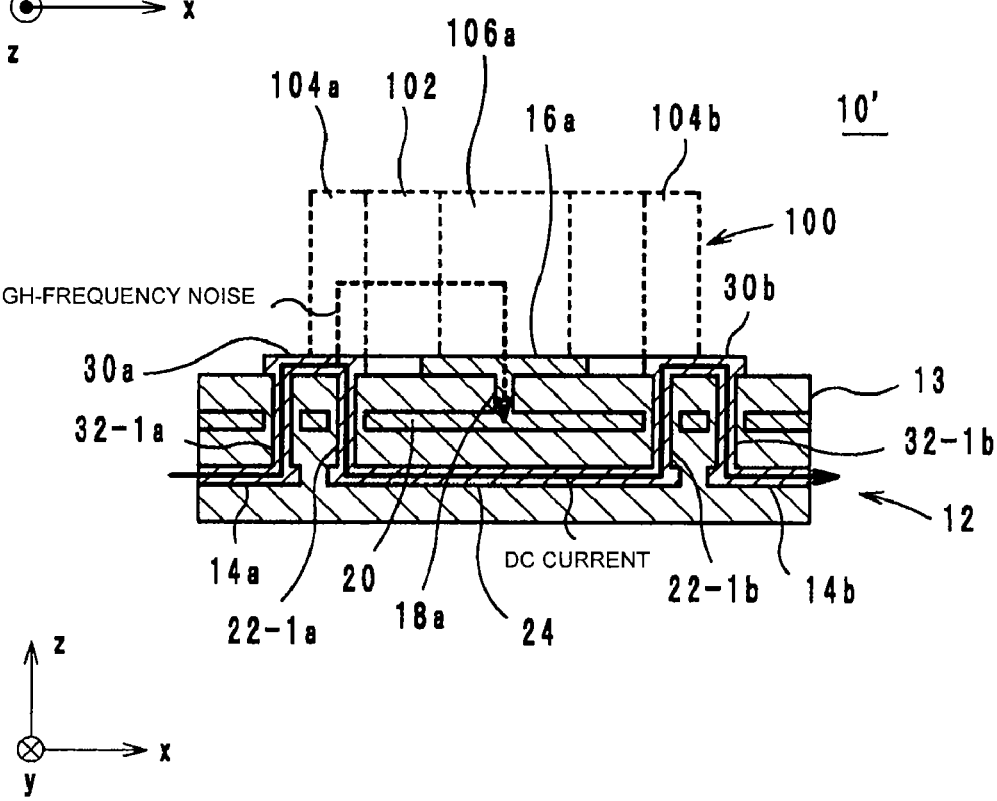

The substrate 12 having the above-described construction and the electronic device 10 including the substrate 12 are not limited to ones in the foregoing embodiment and can be modified as required. FIGS. 3A and 3B show an electronic device 10' according to a modification of the electronic device 10. FIG. 3A is a top plan view of the electronic device 10', and FIG. 3B is a sectional structural view of the electronic device 10'. In FIGS. 3A and 3B, a feedthrough capacitor 100 is indicated by dotted lines. Also, in the top plan view of FIG. 3A, it is assumed that a lengthwise direction of the feedthrough capacitor 100 defines the x-axis direction, a widthwise direction of the feedthrough capacitor 100 defines the y-axis direction, and a direction perpendicular to the x-axis direction and the y-axis direction defines the z-axis direction. In FIGS. 3A and 3B, the same components as those in FIGS. 1A and 1B are denoted by the same reference numerals.

The electronic device 10 and the electronic device 10' differ from each other in that, while the power planes 14a and 14b in the electronic device 10 are disposed on the first principal surface of the substrate body 13, the power planes 14a and 14b in the electronic device 10' are disposed inside the substrate body 13. The following description focuses on the difference.

As shown in FIGS. 3A and 3B, lands 30a and 30b are formed on the first principal surface of the substrate body 13. The lands 30a and 30b are disposed at the same positions as the power planes 14a and 14b in FIG. 1. However, the lands 30a and 30b are shorter in the x-axis direction than the power planes 14a and 14b in FIG. 1.

Also, as shown in FIGS. 3A and 3B, the power planes 14a and 14b are disposed inside the substrate body 13 to extend in the x-axis direction. Respective one ends of the power planes 14a and 14b overlap with one ends of the lands 30a and 30b, respectively, when viewed from the z-axis direction. Further, the power plane 14a and the land 30a are electrically connected to each other through via-hole conductors 32-1a, 32-2a and 32-3a extending in the z-axis direction, and the power plane 14b and the land 30b are electrically connected to each other through via-hole conductors 32-1b, 32-2b and 32-3b extending in the z-axis direction. The remaining construction of the electronic device 10' is the same as that of the electronic device 10, and hence a description thereof is omitted here.

Like the electronic device 10, the electronic device 10' having the above-described construction has the following advantages: heat generation of the feedthrough capacitor 100 can be suppressed; downsizing is possible; and high-frequency noise can be removed from the DC current efficiently.

In the electronic devices 10 and 10', the wiring conductor 24 is disposed inside the substrate body 13. However, the wiring conductor 24 may be disposed, for example, on the second principal surface of the substrate body 13. Further, in the electronic device 10', the power planes 14a and 14b may be disposed on the second principal surface of the substrate body 13.

(Analysis Results and Experiment Results)

Figure 7A:
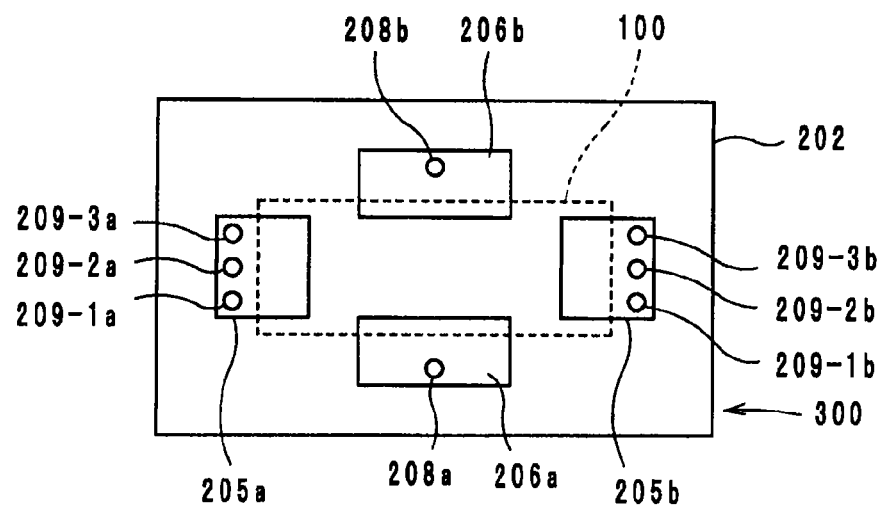
FIG. 7A is a top plan view of a known substrate.
Figure 7B:
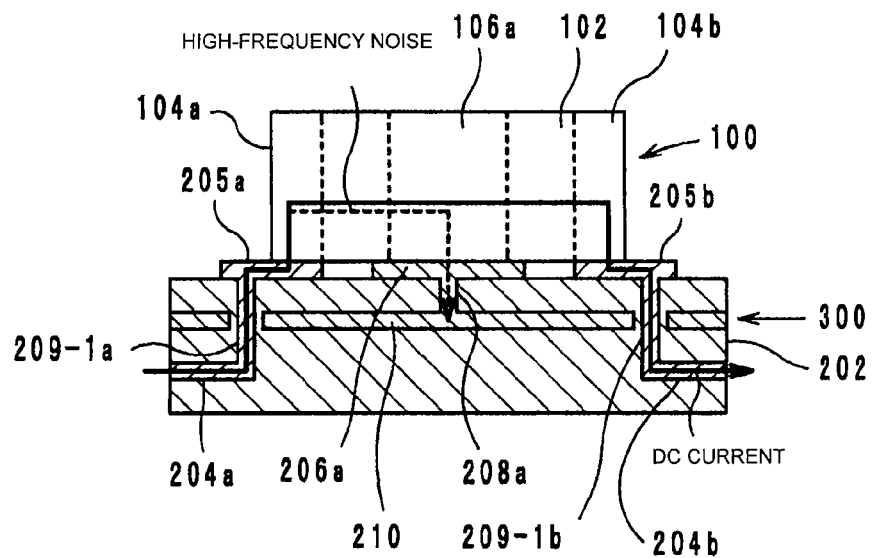
FIG. 7B is a sectional structural view of the known substrate with a feedthrough capacitor mounted thereon.
Figure 8:
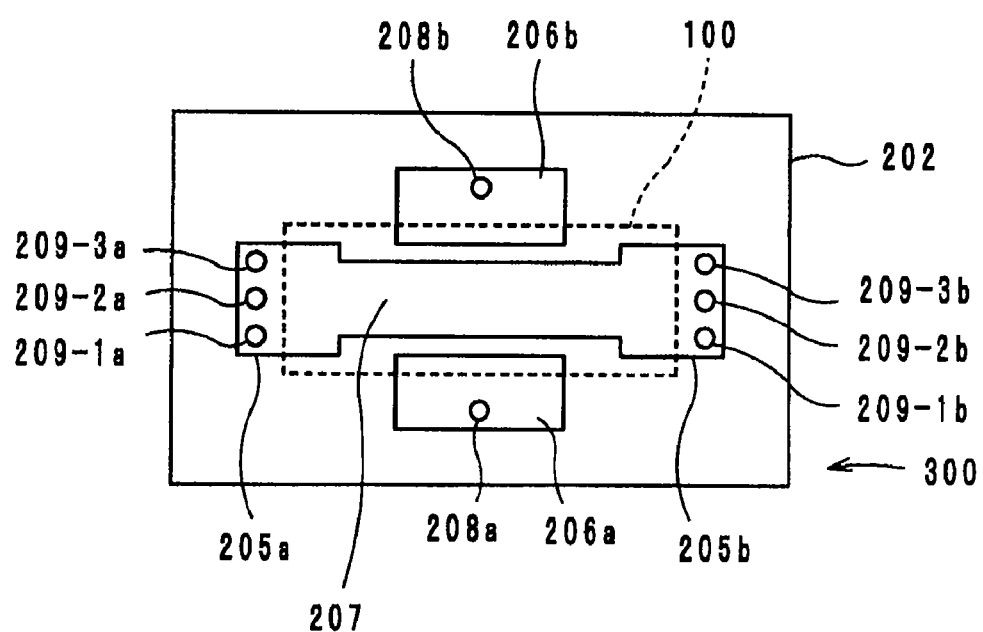
FIG. 8 is a top plan view of an electronic device described in Japanese Unexamined Patent Application Publication No. 6-349678.
Figure 10:
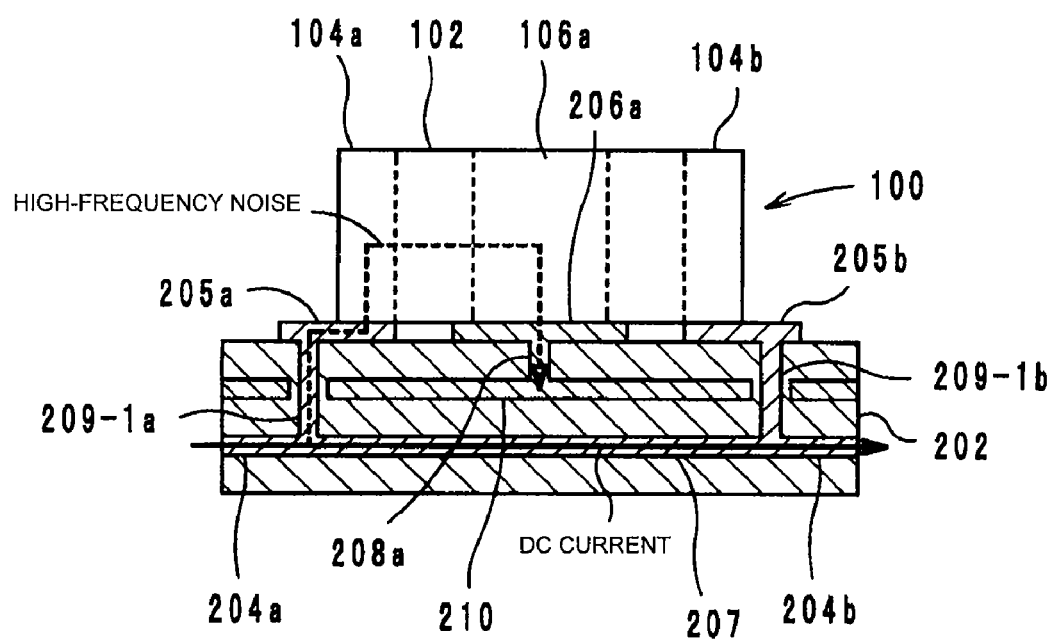
FIG. 10 is a sectional structural view of an electronic device to which a capacitor mounting structure according to Japanese Unexamined Patent Application Publication No. 2003-282347 is applied.

To further clarify the advantages of the present invention, the inventors conducted analyses and experiments as follows. One model of the electronic device constructed as shown in FIGS. 7A and 7B (hereinafter referred to as a "first model"), another model of the electronic device constructed as shown in FIG. 10 (hereinafter referred to as a "second model"), and still another model of the electronic device constructed as shown in FIGS. 3A and 3B and denoted by 10' (hereinafter referred to as a "third model") were prepared. The first model and the second model represent comparative examples, while the third model is according to the present invention. Insertion loss characteristics of those three models were calculated by using the network analyzer made by Agilent Technologies. Analysis was made under the following conditions.

The substrate was a three-layered substrate having dimensions of 10 mm×10 mm. The substrate had a thickness of 1.2 mm. The ground plane was disposed in the second layer of the substrate. The feedthrough capacitor was a ceramic capacitor having dimensions of 4.5 mm×3.2 mm×2.0 mm. Each ceramic layer of the feedthrough capacitor had a thickness of 1 µm. Six sets of internal electrodes, each set including two internal electrodes, were stacked. Each of the electrodes was made of nickel.

Figure 4:
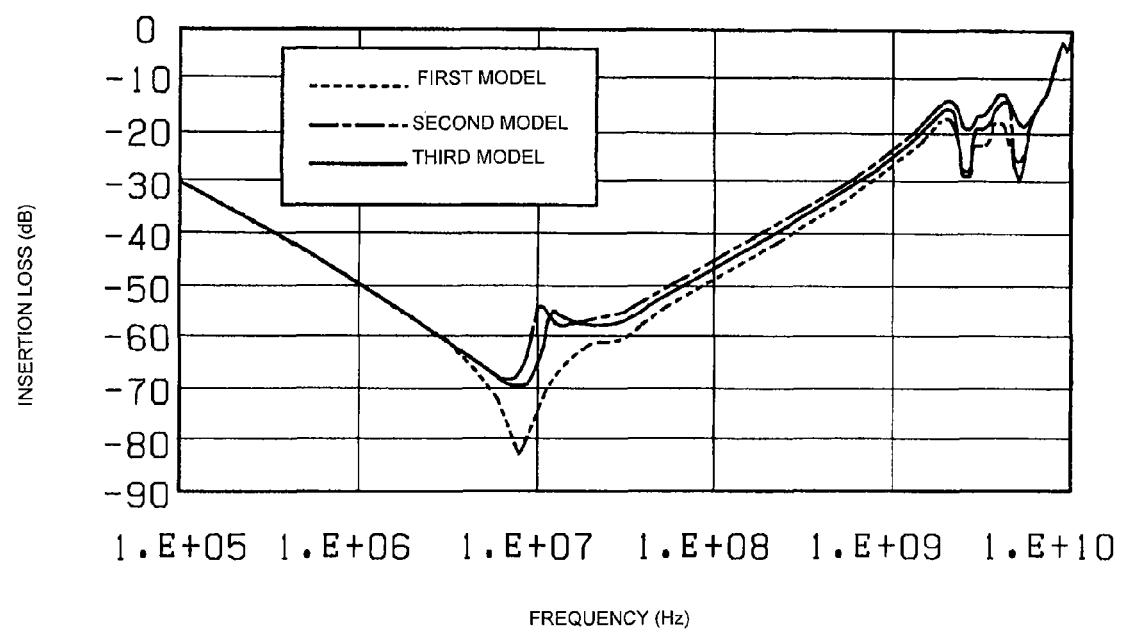
FIG. 4 is a graph showing insertion loss characteristics of a first to a third model, each curve showing the relationship between insertion loss and frequency of each of the models.

The insertion loss characteristics of the first to third models were calculated under the above-described analysis conditions, and FIG. 4 shows the results of the calculation. FIG. 4 is a graph showing the relationship between insertion loss and frequency of the first to third models. In the graph of FIG. 4, the vertical axis represents insertion loss, and the horizontal axis represents frequency.

As shown in FIG. 4, the insertion loss characteristic of the third model according to the present invention is between the insertion loss characteristic of the first model and the insertion loss characteristic of the second model. The second model shown in FIG. 10 and the third model shown in FIGS. 3A and 3B differ from each other in the following point: in the third model, the current path including the wiring conductor includes via-hole conductors, while in the second model, the current path including the wiring conductor includes no via-hole conductors. Thus, it is understood from the analysis results that the insertion loss characteristic of the electronic device can be improved by including via-hole conductors in the current path including the wiring conductor, as in the third model shown in FIGS. 3A and 3B.

On the other hand, the insertion loss characteristic of the first model is superior to that of the third model. The reason is that, in the first model shown in FIG. 7, the current path is not divided into two routes and the high-frequency noise is all inputted to the feedthrough electrode of the feedthrough capacitor.

Further, the inventors conducted experiments for measuring a DC resistance between the opposite power planes in each of the first to third models by using a multimeter made by HIOKI E.E. Corporation. The experiment results are shown in Table 1 given below.

TABLE 1

|  | DC Resistance (mΩ) |
| --- | --- |
| First Model | 17.71 |
| Second Model | 1.25 |
| Third Model | 1.40 |

As seen from Table 1, the DC resistance of the third model according to the present invention is smaller than that of the first model. Thus, it is understood that the third model according to the present invention can suppress heat generation of the feedthrough capacitor.

As discussed above, the first model can improve the insertion loss characteristic, but it has a difficulty in suppressing heat generation of the feedthrough capacitor. The second model can suppress heat generation of the feedthrough capacitor, but it has a difficulty in improving the insertion loss characteristic.

On the other hand, as seen from FIG. 4 and Table 1, the third model has a good insertion loss characteristic and can suppress heat generation of the feedthrough capacitor.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. An electronic device comprising:
   a substrate having a first principal surface and a second principal surface; and
   a capacitor mounted on the first principal surface of the substrate, wherein the capacitor includes:
   a body;
   a feedthrough electrode penetrating the body;
   a capacitor electrode forming capacity in cooperation with the feedthrough electrode;
   a first external electrode and a second external electrode electrically connected to opposite ends of the feedthrough electrode, respectively; and
   a third external electrode electrically connected to the capacitor electrode, and wherein the substrate includes:
   a wiring conductor positioned one of on the second principal surface and inside the substrate; and
   a via-hole conductor formed inside the substrate and electrically connected to the wiring conductor,
wherein the feedthrough electrode, the first external electrode, and the second external electrode constitute a first current path, and
wherein the wiring conductor and the via-hole conductor constitute a second current path electrically connected in parallel to the first current path.

2. The electronic device according to claim 1, wherein the via-hole conductor comprises a first via-hole conductor and a second via-hole conductor which are electrically connected to the wiring conductor, and
wherein the substrate further includes:
   a first connecting conductor which is electrically connected to the first via-hole conductor and is electrically connected to the first external electrode; and
   a second connecting conductor which is electrically connected to the second via-hole conductor and is electrically connected to the second external electrode.

3. The electronic device according to claim 2, wherein the first connecting conductor is a first power plane formed on the first principal surface of the substrate, and
wherein the second connecting conductor is a second power plane formed on the first principal surface of the substrate.

4. The electronic device according to claim 2, wherein the substrate further includes:
   a first power plane formed inside the substrate or on the second principal surface thereof and electrically connected to the first connecting conductor; and
   a second power plane formed inside the substrate or on the second principal surface thereof and electrically connected to the second connecting conductor.

5. The electronic device according to claim 1, wherein the wiring conductor overlaps with the feedthrough capacitor.

6. The electronic device according to claim 1, wherein the wiring conductor has a DC resistance smaller than that of the feedthrough electrode.

7. The electronic device according to claim 1, wherein the second current path has an impedance smaller than that of the first current path.

8. A substrate having a first principal surface and a second principal surface, the first principal surface configured for mounting a capacitor that includes a feedthrough electrode penetrating a capacitor body, and a capacitor electrode which forms capacity in cooperation with the feedthrough electrode, the substrate comprising:
   a wiring conductor positioned one of on the second principal surface and inside the substrate; and
   a via-hole conductor formed inside the substrate and electrically connected to the wiring conductor,
   wherein the wiring conductor and the via-hole conductor constitute a second current path electrically connected in parallel to a first current path in the capacitor.

9. The electronic device according to claim 7, wherein the wiring conductor has a DC resistance smaller than that of the feedthrough electrode.

10. The electronic device according to claim 7, wherein the second current path has an impedance smaller than that of the first current path.

* * * * *